United States Patent [19]

Nozoe et al.

[11] Patent Number: 4,667,235
[45] Date of Patent: May 19, 1987

[54] TELETEXT DECODER

[75] Inventors: Toshiro Nozoe, Yamatokouriyama; Akira Yamashita, Takatsuki; Masayoshi Hirashima, Ibaraki; Shin Fukuda, Hirakata, all of Japan

[73] Assignee: Matsushita Electric Industrial Co., Ltd., Kadoma, Japan

[21] Appl. No.: 511,086

[22] Filed: Jul. 5, 1983

[30] Foreign Application Priority Data

Jul. 5, 1982 [JP] Japan .................. 57-117553

[51] Int. Cl.$^4$ ........................................... H04N 7/087
[52] U.S. Cl. ................................. 358/147; 358/146
[58] Field of Search .............. 358/147, 146, 142; 375/76; 328/139; 307/358

[56] References Cited

U.S. PATENT DOCUMENTS

| 4,202,012 | 5/1980 | Hirashima | 358/147 |
| 4,222,073 | 9/1980 | Hirashima | 358/147 |
| 4,303,942 | 12/1981 | Fukuda et al. | 358/147 |
| 4,318,128 | 3/1982 | Sauvanet | 358/147 |
| 4,384,304 | 5/1983 | Ohta et al. | 358/147 |

FOREIGN PATENT DOCUMENTS 1523307  8/1978  United Kingdom ............... 358/147

Primary Examiner—Tommy P. Chin
Assistant Examiner—David E. Harvey
Attorney, Agent, or Firm—Wenderoth, Lind & Ponack

[57] ABSTRACT

A teletext decoder having a character pickup circuit superior in the antinoise property and response characteristic by allowing signals only in the vicinity of clock run-in signals to pass, simultaneously detecting the amplitude of clock run-in signals through a band-pass filter circuit, gating framing code signals and reproduced clock and slice data, and integrating and holding the clock run-in signals.

22 Claims, 19 Drawing Figures

FIG. 2.
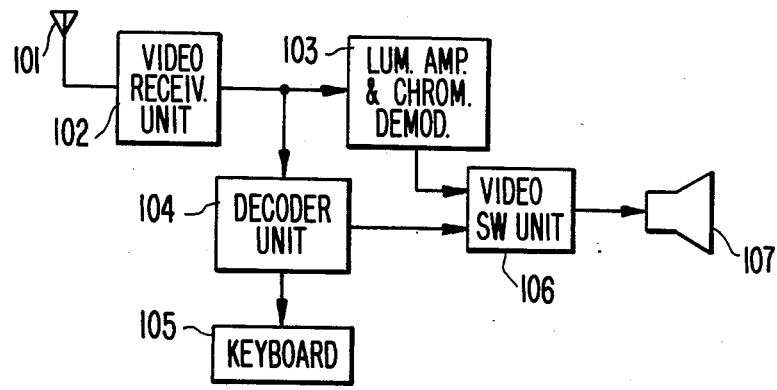
FIG. 4.
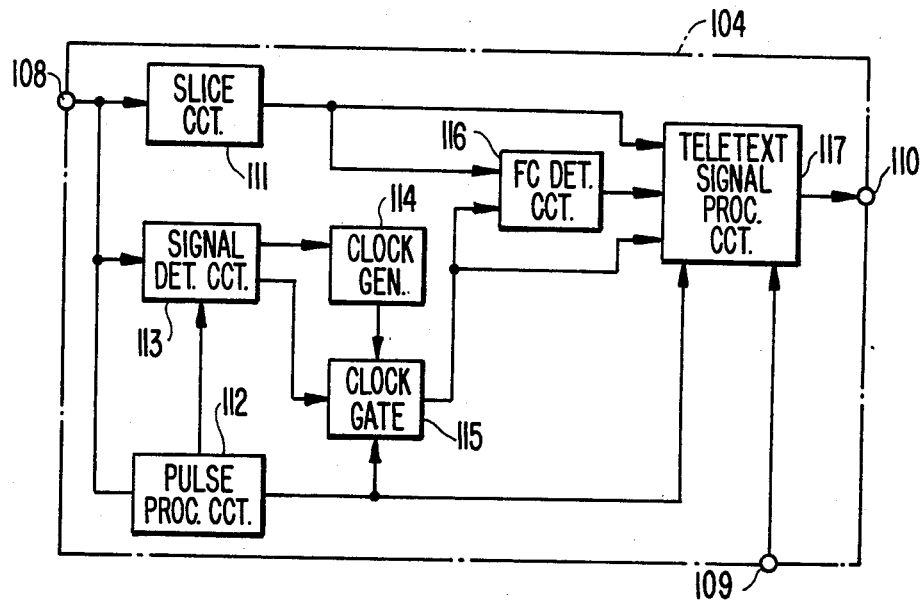
FIG. 5.

TELETEXT DECODER

BACKGROUND OF THE INVENTION

1. Field of the Invention

This invention relates to a teletext decoder, and more particularly to a teletext decoder which is of less error even in the receiving condition of being affected largely by noises and can reproduce stable and high quality pictures against variation in environment.

This invention relates further to a teletext decoder having a data slicing circuit which slices information (to be hereinafter called the teletext signal) superposed during a predetermined horizontal scanning period in the vertical blanking period of composite television signals and converts the sliced information into the binary digital signal.

2. Description of the Prior Art

The teletext broadcast has already been carried out in U.K. Also, in Japan, a teletext system using the pattern transmission system was accepted by the Radio-acoustics Inquiry Commission in March, 1981. The picture data of these systems all are binary non-return-to-zero (NRT) signals which are superposed in unit of one horizontal scanning period (1H) during the vertical blanking period of the video signal. FIG. 1 shows waveform charts of the superposed teletext signals. In FIG. 1-(A), reference numeral 1 designates a horizontal synchronizing signal, 2 designates a color burst signal, 3, 4 and 5 designate binary signals to be superposed, a portion 3 showing a clock run-in signal (to be hereinafter called CR), a portion 4 showing a framing code signal (to be hereinafter called FC), a portion 5 including various data information, 6 designates the enlarged CR, and 7 designates the enlarged FC. CR is the synchronizing signal for reproducing the data sampling clock signal and FC is for synchronizing the data packet, the CR and FC being common to all the teletext data. The teletext decoder can receive and reproduce the subsequent data with accuracy by detecting FC. Accordingly, it is very important for the reception performance to enable the data read-in sampling clock signal to be synchronized with CR and also FC to be detected stably at the regular timing. If FC is not detected at the regular timing, or at the abnormal timing, erroneous signals are received to lead to a display of random picture. Since FC is important as described above, the teletext decoder is designed to have an error-correcting function for one bit so that even when a one bit error is generated by noise, FC is adapted to be detectable with accuracy.

FIG. 2 is an illustration of framing code detection, showing each step of sequential arrival of teletext signal from CR and the number of bits coincident with that in the comparison byte. In FIG. 2, the steps (1) through (7) are for comparison of CR, the step (8) shows arrival of the first one bit of FC, and the following steps are shown at every clock signal. The step (15) is the moment when the arrival bits all are coincident with the comparison signals, at which time FC detection pulse is generated. The numbers of coincident bits prior to the step (15) all are 5 or less, so that when the number of coincident bits is 7 or more in the teletext decoder, the FC detection pulse is generated, resulting in that the one bit error correction can be performed.

Now, it is necessary for detecting the FC in the actual teletext decoder to slice the central portion of amplitude of teletext signal superposed on the video signal to thereby obtain the wave-shaped slice data signal and sampling clock signal in phase synchronized with CR. The slicing point in the teletext signal is required to be accurately sliced at the central portion, even when the amplitude or DC level thereof is different between the broadcasting stations or between the performances of teletext decoders. Generally, the slicer circuit is designed to detect its center level by a proper time constant during the CR period and thereafter keep the level in a value within a fixed range. Hence, the slice data signal in the vicinity of CR, especially in the first half, is occasionally different from the transmitted signal. The follow-up property of the above slicer circuit will decide a timing at which the data becomes normal, but this timing should not be too early in order to improve the antinoise characteristic. The sampling clock signal reproduction, as the same as the above, is synchronized in phase with CR to be normal in phase, but a time to draw the clock signal into the normal phase is required and the clock phase in the first half of CR is not normal. Moreover, when in the weak electric field, the jitters of the above slice data signal and sampling clock signal become larger. The FC detection circuit, which has the one bit error correcting function as aforesaid, conversely is liable to detect FC rather by mistake at the timing when the number of coincident bits in FIG. 2 is 5, especially in the first half of CR, there is a high probability of detecting FC by mistake.

Conventionally, a means to solve the above problem is to generate gate pulse (to be hereinafter abbreviated to the FC gate pulse) from the horizontal synchronizing signal, therby allowing only the FC detection pulse of proper timing to pass the gate. According to the technical report of teletext broadcast submitted in March, 1981, the time from the leading edge of horizontal synchronizing signal to the first bit of CR is $(0.154 \pm 0.005)$H as shown in FIG. 1, which is given by $(56 \pm 2)$Tc when the transmitting time for one bit of data is represented by 1Tc($=175$ns). In other words, the location where the teletext signal is superposed moves by 4Tc on the basis of the leading edge of horizontal synchronizing signal. The horizontal synchronizing signal as the standard employs an oscillation output of synchronizing television signal multiplied by the horizontal AFC, in which movement of 5 to 10Tc is suggested in consideration of disturbance of horizontal AFC caused by the equalizing pulse during the vertical blanking period, a shift of the adjusting point of horizontal AFC, and displacement by the temperature characteristic. Furthermore, in consideration of the displacement by the temperature characteristic or adjustment accuracy of a delay circuit which decides the leading edge of the FC gate pulse from the leading edge of horizontal synchronizing signal, the FC gate pulse further moves largely, so that the wrong FC detection pulse may still be generated.

Since the teletext signals are subjected to the band restriction as shown in FIG. 1-(B), the data signals become the pulse train of sine-wave shape. Now, assuming that the waveform in FIG. 1-(B) is compared with the level shown by the one-dot chain line 8 and then is sliced, the sliced output waveform is as shown in FIG. 1-C, so that the binary NRZ signal prior to the superposition on the television signal is reproduced. The teletext decoder reads such sliced data by the proper sampling clock signal, thereby carrying out data reading operation.

An example of conventional circuit which produces the above slice level 8 and slices the superposed teletext signal is shown in FIG. 3, in which an antenna 101 receives the RF signal and composite video signals corresponding to FIG. 1-A are obtained as an output of a video receiving unit 102. The composite video signals are applied to one terminal of a voltage comparator 12 and further to a positive peak detection circuit 13 and a negative peak detection circuit 14, intermediate voltage of outputs of both peak detection circuits 13 and 14 being applied as the slice level to the other terminal of voltage comparator 12, thereby reproducing the superposed signal into the binary digital signal.

This method, however, has the peak detection circuits 13 and 14 so as to detect the peak of noise when the RF input level is small, thereby often reproducing by mistake the superposed signals. Also, when the group delay characteristic of a video demodulator generates the distortion in waveforms, the peak detection is carried out with respect to the distorted waveform, so that a proper sliced level cannot be set.

The CR of signal pattern of 16 bits: 1010 . . . , is used in common to every country, but FC is different. FIG. 1-(C) shows FC adopted in Japan and FIGS. 1-(D), -(E) and -(F) show FCs ruled by the NORTH AMERICAN BROADCAST TELETEXT SPECIFICATION (to be hereinafter abbreviated to NABTS) which will be adopted in U.S.A. In a case of detecting CR and FC signals to obtain the sliced level, the sliced level will vary according to the FC pattern.

SUMMARY OF THE INVENTION

An object of the invention is to provide a teletext decoder comprising a band-pass filter for selecting CR in the teletext signal, a gate circuit passing signals in the vicinity of CR, and an amplitude detection circuit for detecting the envelope of CR, so that the amplitude of CR is detected to generate the detected pulse to thereby detect the CR superposed position with accuracy, less influence of noises, and not on the basis of the horizontal synchronizing signal, and generate only a proper FC detection pulse in such a manner that the detection pulse is delayed for a proper time and thereafter the FC detection circuit is actuated, or the FC gate is open, to block the FC detection pulse previously generated, thus causing less error.

Another object of the invention is to provide a teletext decoder having a data slicing circuit superior in the antinoise and anti-group-delay characteristics, and always applicable of a proper sliced level without adjustment with respect to the level variation of superposed signals at the transmission side or variation in signal amplitude of detection output of the teletext decoder, thereby obtaining a proper slice characteristic.

Still another object of the invention is to provide a teletext decoder comprising circuits suitable for integrated circuits so as to be manufactured at a low cost.

A further object of the invention is to provide a teletext decoder having a superior slice characteristic not affected by FC even when FC is changed according to the service contents.

Effects of the present invention are as follows:

Firstly, this invention produces the data slice level by use of the integrator so that the integration circuit functions to average noises and the slice level is not easy to be affected by the noises even when largely mixed for a weak RF input signal. Since the integration circuit of the invention is linear, its output is less affected by waveform distortion caused by group delay distortion of the video demodulator, thereby obtaining a good slice characteristic of less error.

Secondly, even when a variation occurs in the level of superposed signal at the transmission side or the signal amplitude of video detection output at the receiver, since the mean value (sliced level) of signal after passing the integrator converges to the mean value of teletext data signal amplitude, i.e., the intermediate level, there is no need of adjustment of decoder even when the variation occurs.

Thirdly, the sliced voltage is preset at about intermediate level of teletext data signal prior to passing the integrator, so that the signal can be raised through the integrator to the intermediate level of teletext data signal for a very short time and the erroneous FC detection apt to occur at the first half of CR signal can be reduced in a largely lower probability. Furthermore, the circuit of the invention can make the preset voltage very stable with respect to the power source fluctuation or the temperature change.

Fourthly, since the teletext data signal before sliced has subjected to the band-pass limit as aforesaid to become distored, when the amplitude during the slicing is small, the sliced data is apt to jitter due to variation by noise of sliced level or the like, but the pedestal level of input video signal is clamped and amplified as in the invention so that even when the intermediate level of video signal changes, the central operation point of the amplifier is kept unchanged, thereby making it possible to enlarge the dynamic range of the amplifier with respect to the teletext data signal portion and raise the amplification degree and reduce the jitters after slicing.

Fifthly, the circuit of the invention is easy for integration except for the integrator portion, so that it can be manufactured in the integration circuit at a low cost.

Sixthly, since the timing for sliced level hold depends on the signal detection of CR portion, the motion of sliced level hold timing is small. Especially, in a case where a delay from the signal detection to the hold timing is counted through the sampling clock signal, the motion of hold timing depends only on motion of signal detection, thereby being restricted to be small. Accordingly, the probability that the hold timing enters into FC diminishes, so that, even when FC changes by the service contents as in NABTS in U.S.A., the circuit is less affected. Hence, the decoder of the invention is very effective in practical use.

The above and other objects and features of the invention will become more apparent in the detailed description taken with the accompanying drawings in which:

BRIEF DESCRIPTION OF THE DRAWINGS

FIG. 2 is an illustration of framing code detection;

FIG. 4 is an embodiment of a teletext decoder of the invention, shown in general;

FIG. 5 is a block diagram of an example of a decoder unit in the FIG. 4 embodiment;

DETAILED DESCRIPTION OF THE INVENTION

Figure 1:
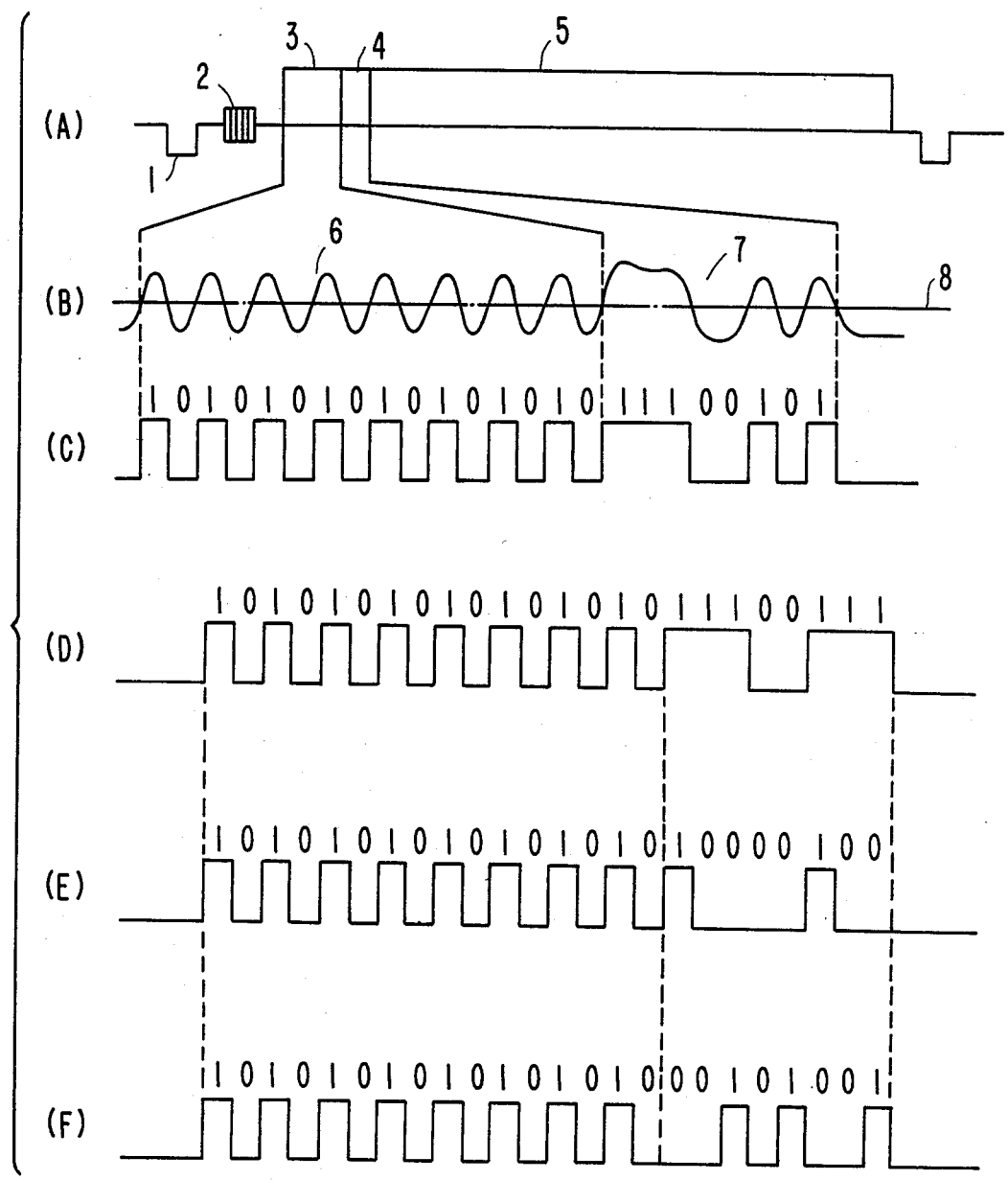
FIG. 1 shows waveform charts of teletext signals.
Figure 3:
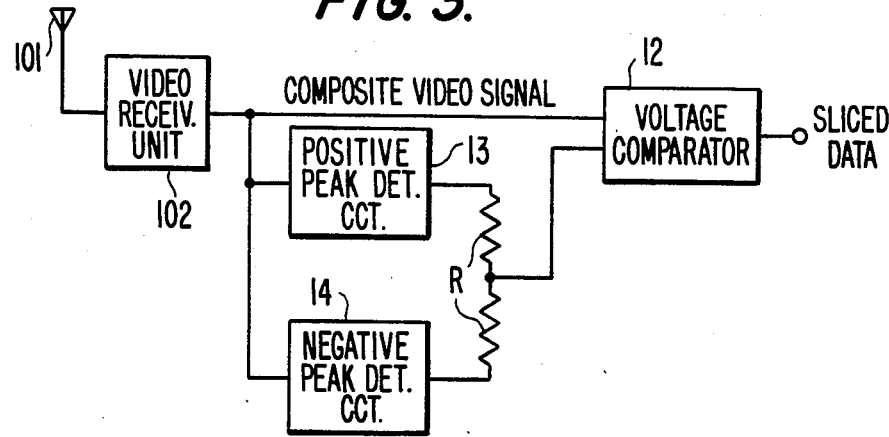
FIG. 3 is a block diagram of a conventional data slicing circuit.

Referring to FIG. 4, reference numeral 101 designates an antenna, 102 designates a video receiving unit, 103 designates a luminance signal amplifier and a chrominance signal demodulator, 104 designates a decoder unit for the teletext broad cast, 105 designates a keyboard through which a desired program is appointed to be received, 106 designates a video switching unit for switching the video image signal under reception and the demodulated character image signal, and 107 designates a cathode ray tube (CRT) for displaying the switched image signal.

Referring to FIG. 5, reference numeral 108 designates an input terminal given a composite video signal detected by the video receiving unit 102, 109 designates an input terminal given a command pulse from the keyboard 105, 110 designates an output terminal which outputs the character and picture signals demodulated by the decoder unit 104 and connects with the video switching unit 106, 111 designates a slicing circuit for generating a sliced data signal from the teletext signal among the composite video signals fed from the input terminal 108, 112 designates a synchronous separator (at need including a horizontal AFC circuit and a horizontal oscillation circuit) and a pulse generator circuit for generating various gate pulses, and 113 designates a signal level detector especially important in the invention and having the function to be discussed below, the signal-level detector 113 including a band-pass filter for selectively passing the CR of teletext signal, a gate circuit allowed to pass signals in the vicinity of CR, a doubler to double the frequency of output signal of the gate circuit, an amplitude detection circuit for detecting the envelope of the output signal from the doubler and comparing the envelope with a predetermined reference level thereby detecting the amplitude of CR, and a delay circuit for delaying the output signal of the amplitude detection circuit at need toward the leading edge of the FC as near as possible in design.

Also, 114 designates a sampling clock generating circuit which generates a sampling clock signal for sampling the sliced data signal in synchronism with the signal of doubled CR fed from the signal-level detector 113, and 115 designates a sampling clock generating circuit including a flip-flop set by an output of signal detection circuit 113 and reset by the horizontal synchronizing signal or signal similar thereto, fed from the pulse generator 112 and a gate circuit controlled by the output of the flip-flop to gate the output of sampling clock generator 114.

Reference numeral 116 designates a FC detection circuit which detects FC from the sliced data signal from the slicing circuit 111 and sampling clock signal from the sampling clock generator 115, thereby generating the FC detection pulse, the signal-level detector 113 detecting the amplitude of CR to open the sampling clock gate circuit 115 with the timing as similar as possible to FC. With this timing, when the time constant is so selected that the phase of output from the sampling clock generator 114 and the output of slicing circuit 111 have the desired levels respectively, the FC is detected with the extremely high probability only at the normal FC detecting point even with a signal of poor S/N during the reception in the weak electric field. Even when noises are sliced as the data in the period where no teletext signal is superposed (e.g., between the horizontal synchronizing signal and CR), the signal-level detector 113 is not easy to malfunction because of removal of noise component by the band-pass filter when picking up CR, resulting in that FC is not detected by mistake as far as the sampling clock signal is blocked by the sampling clock gate circuit 115. 117 designates a teletext signal processing circuit which stores the information signal detected and reproduced, after detection of FC, from the sliced data signal and outputs it as a signal which can be displayed in CRT.

Figure 6:
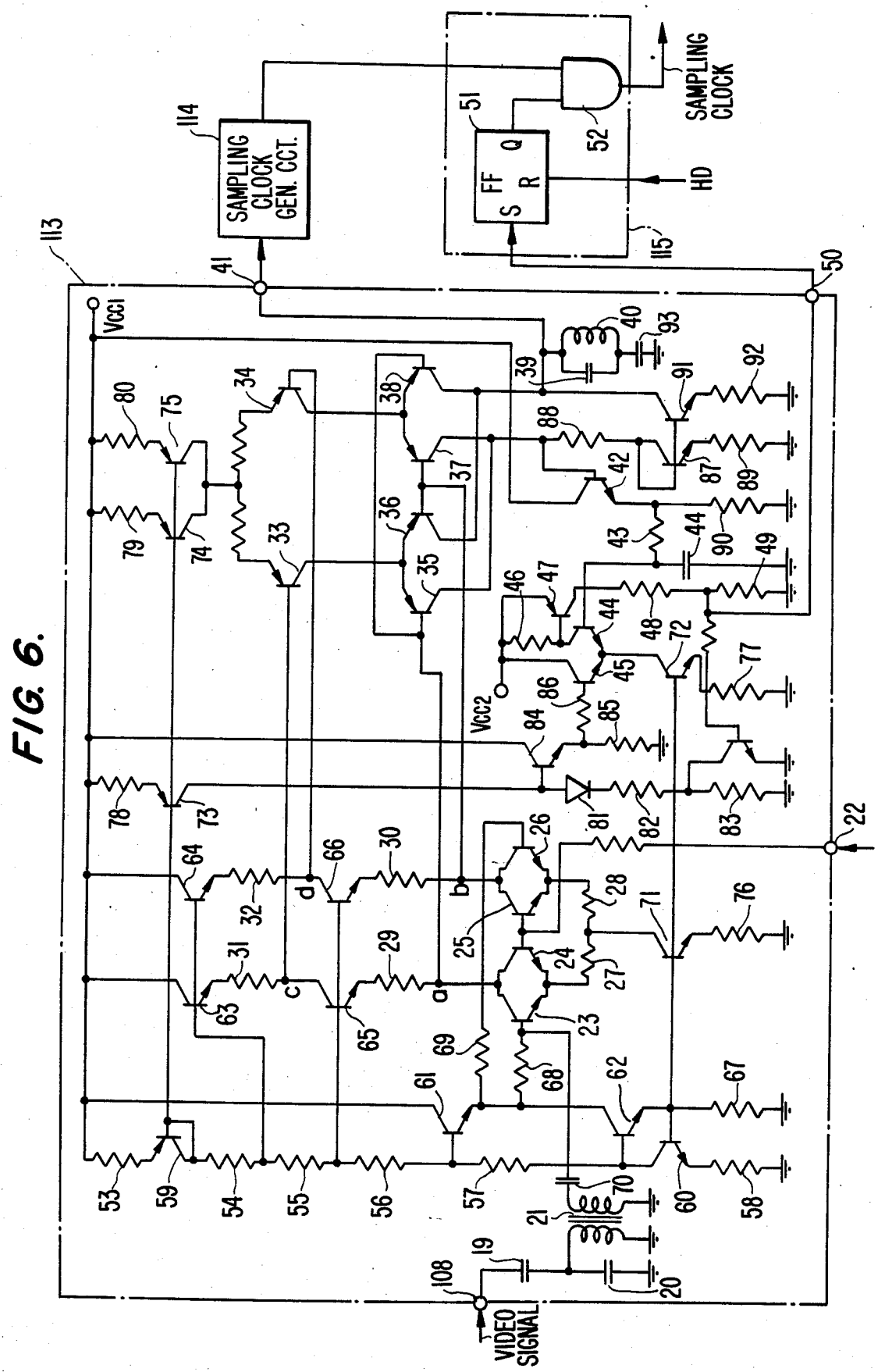
FIG. 6 is a concrete circuit diagram of a signal detection circuit in the decoder unit in FIG. 5.
Figure 7:
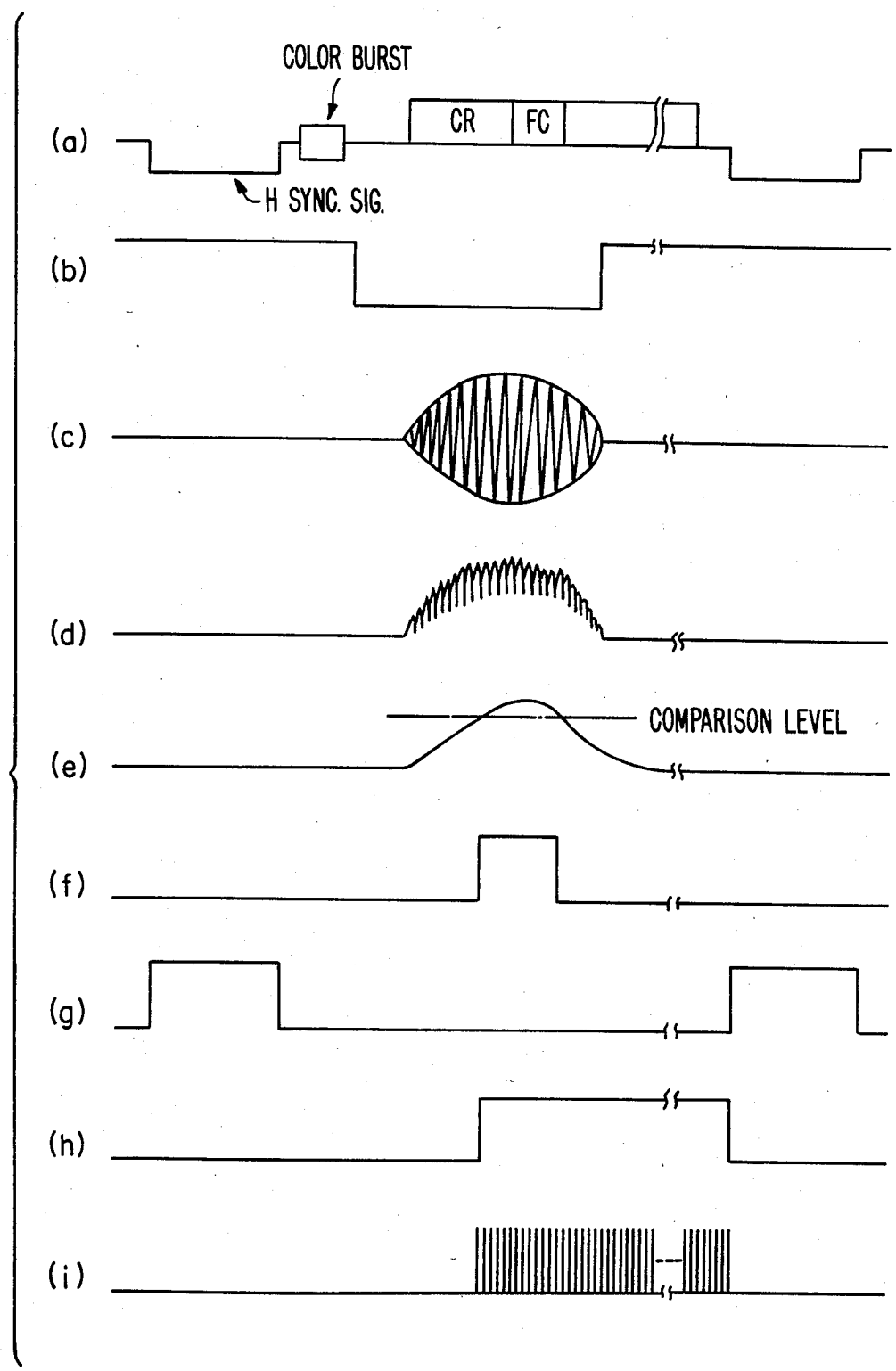
FIG. 7 shows waveform charts in operation of the signal detection circuit in FIG. 6.
Figure 9:
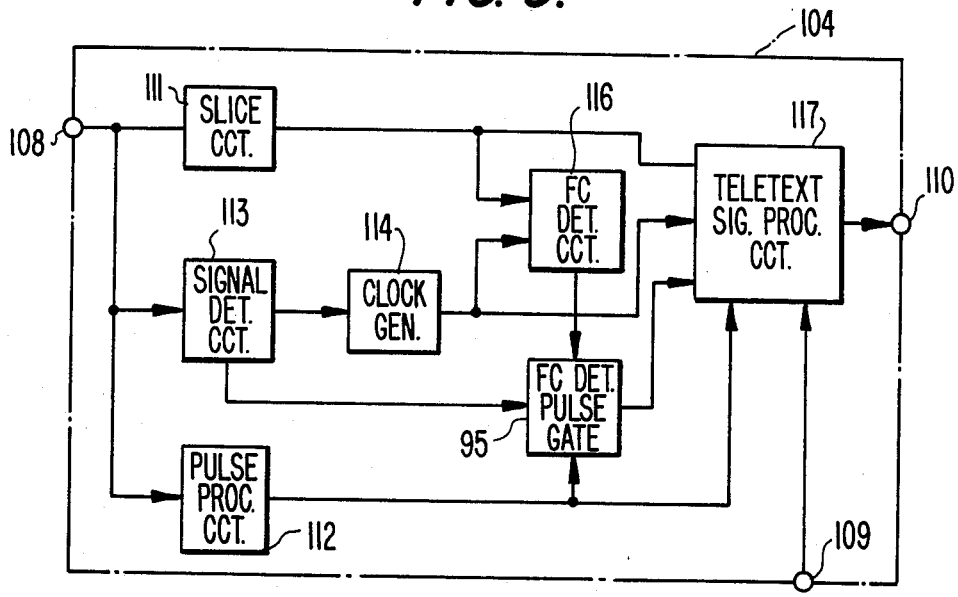

Referring to FIGS. 6 and 7, reference numeral 108 designates an input terminal for the composite video signal. A teletext signal, as shown in FIG. 7-(a), is superposed during the specified horizontal scan period in the vertical blanking period, which is given through the input terminal 108 to a band-pass filter (its center frequency is the fundamental frequency of CR: 2.86 MHz in Japan) comprising capacitors 19 and 20 and a transformer 21, through which only the 2.86 MHz component in the teletext signal passes. An input terminal 22 for the gate signal from the pulse generator 112 is given a gate pulse as shown in FIG. 7-(b), the gate pulse actuating transistors 23, 24, 25 and 26 so that the collectors thereof output the components of CR and FC among the signals selected by the 2.86 MHz band-pass filter, which components are gated and amplified. In addition, the leading edge of pulse in FIG. 7-(b) need only be located between the color burst and the CR and the trailing edge even somewhat larger is not so problematical when behind FC, whereby a rough design need only be applied. Also, the waveform as shown in FIG. 7-(c) appears at the respective nodes a, b, c, and d, the nodes a and b being reverse in phase, and those c and d are so. The transistors 23 and 26 function as the differential amplifiers, the amplitude at the respective nodes a through d depending on a ratio of resistances 27 and 28 (values thereof are equal) and those 29 and 30 (values thereof are equal) and those 31 and 32 (values thereof are equal). Each output at the respective nodes a to d is given to a differential amplifier in double balance, comprising transistors 33, 34, 35, 36, 37 and 38, and is multiplied therein, in which signals at the nodes a and c and those at the nodes b and d are different in amplitude, but are the same, thereby obtaining signals doubled of 2.86 MHz at the collectors 36 and 38 of transistors 35 and 37 respectively. The outputs from the collectors of transistors 36 and 38 pass through a 5.73 MHz (the frequency two times 2.86 MHz) tuning circuit comprising a capacitor 39 and a coil 40 and then are given to the sampling clock generator 114. The signals, which are made by CR itself, are synchronized in phase with the clock source generated by the sampling clock generator circuit 114, thereby obtaining the sampling clock signal synchronized in phase with CR, as the output of sampling clock generator 114. While, the collector outputs of transistors 35 and 37 having a 5.73 MHz tuning circuit are represented by the full-wave-rectified waveforms of 2.86 MHz as shown in FIG. 7-(d), which pass a buffer of transistor 42 forming the emitter follower and then a low-pass filter comprising a resistance 43 and a capacitor 44, whereby the outputs each are detected of the envelope thereof and delayed by the time constants of resistance 43 and capacitor 44, thus obtaining a signal as shown in FIG. 7-(e). The signal is given to the base of a transistor 44, a transistor 45 defferential thereto is fed at the base thereof with the comparison level shown by the one-dot-chain line in FIG. 7-(e) to thereby compare the amplitude, and an output of load resistance 46 is inverted by a transistor 47, so that the pulse as shown in FIG. 7-(f) is obtained at the collector of transistor 47. The output therefrom is divided by resistances 48 and 49 and passes through an amplitude detection output terminal 50 to set a flip-flop 51 in the sampling clock gate circuit 115. The flip-flop 51 is reset by the HD output of the waveform as shown in FIG. 7-(g), from a synchronous separator 12, thereby obtaining at the Q output a sampling clock gate signal as shown in FIG. 7-(h). The gate signal gates the output of sampling clock generator 14 through an AND-gate 52 so that from the output thereof the sampling clock signal synchronized in phase with CR by 5.73 MHz. as shown in FIG. 9-(i) is obtainable by the timing before FC. When the leading edge of sampling clock pulse is just before FC, erroneous FC is less detected to that extent, but the detection of FC requires a read of data of eight bits of "11100101", so that the timing for the leading edge of sampling clock pulse is decided from just before FC to before 8Tc in consideration of the allowance in design for the amplitude detection circuit, thereby extremely reducing generation of erroneous FC.

In addition, in FIG. 6, a bias circuit comprises resistances 53, 54, 55, 56, 57 and 58 and transistors 59 and 60 and supplies DC bias to each node. Transistors 61, 62, 63, 64, 65 and 66 construct emitter followers, a resistance 67 determining the emitter currents of transistors 61 and 62. Resistances 68 and 69 are base resistances of transistors 23 and 26 and selected to have equal values for well balancing respectively. A capacitor 70 is a coupling capacitor, transistors 71, 72, 73, 74 and 75 are current sources respectively, and resistances 76, 77, 78, 79 and 80 are resistances each of a given current value. A diode 81, resistances 82 and 83, a transistor 83, and resistances 85 and 86, constitute a circuit of the predetermined DC reference level of amplitude detection, the final comparison level thereof is given to the base of transistor 45. On the other hand, DC bias for the base of transistor 44 depends on a transistor 87, resistances 88 and 89 and a DC current flowing therein, transistor 42, the emitter follower of resistance 90, and the base resistance 43 of transistor 44. While, the current sources 73, 74 and 75 together with transistor 59 constitute a current mirror. These transistors are uniformed of characteristics and resistances 78, 79 and 80 are equalized of resistance values, whereby a current flowing in the diode 81 and resistances 82 and 83, can be made equal to that flowing in the transistor 87 and resistances 88 and 89. The diode 81 and transistor 87, the transistors 84 and 42, the resistances 85 and 90, and the resistances 86 and 43, are composed of same type transistors and resistances, so that the relative difference of the base voltage of transistors 45 and 44 is very small with respect to the power source fluctuation. When the values of resistances 27 and 28 and that of a current from the current source 71 are decided with respect to the variation of amplitude of CR signal so that a limiter is actuated when over a certain level, with respect to the signal obtained through a capacitor 70, the amplitude detecting phase is restricted in its displacement caused by amplitude variation. Furthermore, the Q value of 2.86 MHz band-pass filter comprising capacitors 19 and 20 and a transformer 21, is enlarged to enable suppression of amplitude variation from noises, thereby realizing an complitude detection circuit of strong antinoise property.

Thus, the above circuit can realize the very stable detection of amplitude of CR with respect to the power source fluctuation, temperature change, variation of signal amplitude, and noises, and also is used to decide the leading edge of the gate of sampling clock pulse for FC detection, thereby realizing the teletext decoder of less error in FC detection.

In addition, the transistor 91 and resistance 92 are active loads to the transistors 36 and 38 so that the collector of transistor 91, as aforesaid, is connected to the tuning circuit comprising the capacitor 39 and coil 40, thereby giving the reference phase for generating the sampling clock signal to the sampling clock generator 114, the capacitor 93 holding DC voltage of a circuit at the next stage to determine the collector voltage of transistor 91.

The amplitude detection circuit is given the signal by utilizing the collector outputs of transistors 35 and 37, the signal being used in common to both the same and sampling clock generator from pickup of CR to the circuit for doubling it, the output itself is already full-wave-rectified, and the detection efficiency is high not to require further amplification, so that especially a larger circuit is not required as the total system, thereby being advantageous in a low manufacturing cost.

Figure 8:
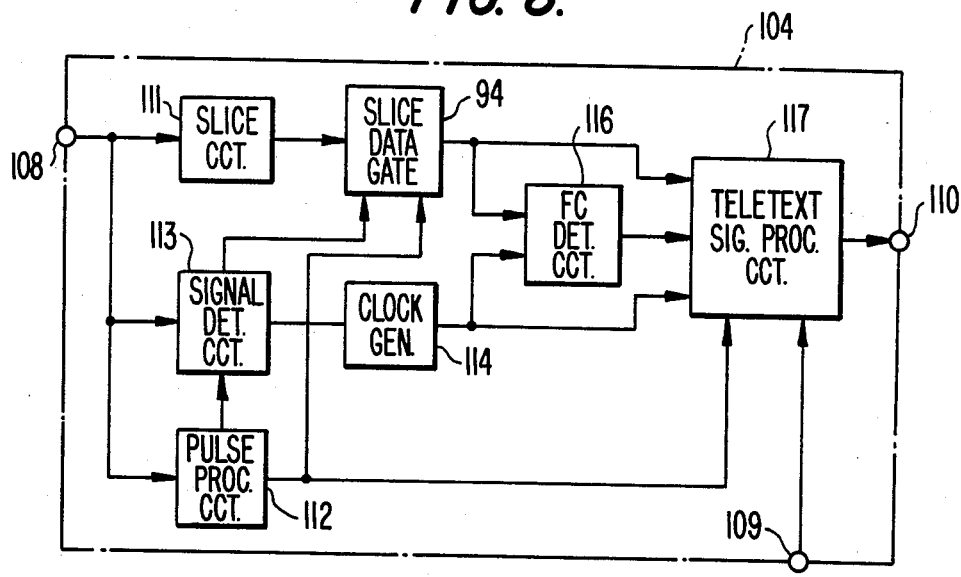
FIGS. 8 and 9 are block diagrams of another example of the decoder unit of the invention.

The above is explanation given on the method to detect the amplitude of CR and gate the sampling clock signal. Next referring to FIG. 8, the decoder 4 of the invention shown in FIG. 4 which gates the sliced data signal by the signal having detected the CR's amplitude, is shown of its internal construction. In FIG. 8, the components of the same function as those in FIG. 5 are designated by the same reference numerals. The construction in FIG. 5 is different from FIG. 8 in that a slice data gate circuit 94 of circuitry the same as the sampling clock gate circuit 115 is disposed so as to gate the output of data slicing circuit 111. Other components in FIGS. 5 and 8 are quite the same and operation thereof is clear as the above explanation. The FC detection, as above-mentioned, is performable only by the existence of sliced data and sampling clock signal, whereby the object of the invention is attained by blocking the sliced data until the amplitude of CR is detected.

Figure 10:
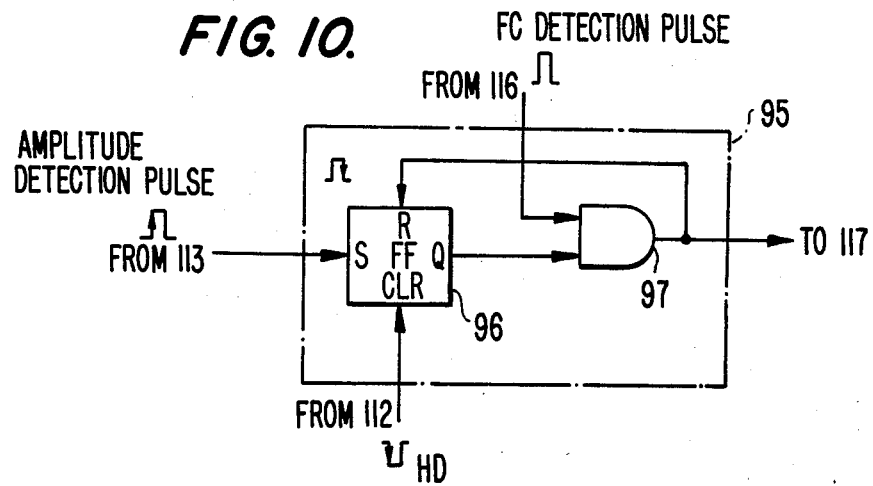
FIG. 10 is a concrete block diagram of a FC detection pulse gate circuit in the decoder unit in FIG. 9.

Next, FIG. 9 is a block diagram of the decoder unit 104 in FIG. 4, to which an FC gate is added so that only the normal FC detection signal generated after detection of CR amplitude is allowed to pass the FC gate, without gating the slice data and sampling clock signal also. The components in FIG. 9 are designated by the same reference numerals as in FIG. 5. In FIG. 9, reference numeral 95 designates a FC detection pulse gate circuit for the above purpose, which is detailed in FIG. 10. In this embodiment, a flip-flop 96 has the clear terminal and the HD output from pulse generator 112 is cleared at the fore edge thereof, the flip-flop 96 is set at the leading edge of amplitude detection pulse from the signal-level detector 113, and an AND gate circuit 97 is open. The FC detection pulse from the FC detection circuit 116 is given to the teletext signal processing circuit 17 through an AND gate circuit 97. The flip-flop 96 is reset at the trailing edge of FC detection pulse of the output of AND gate 97 and the gate thereof is closed. The AND gate 97 is closed until the CR amplitude is detected, so that erroneous FC detection, even when carried out, is blocked, and after the AND gate 97 is open, normal FC is detected, and then the gate 97 is closed at the trailing edge of detected pulse of FC, whereby the FC detection pulse of the normal timing only is given to the teletext signal processing circuit 117.

Figure 11:
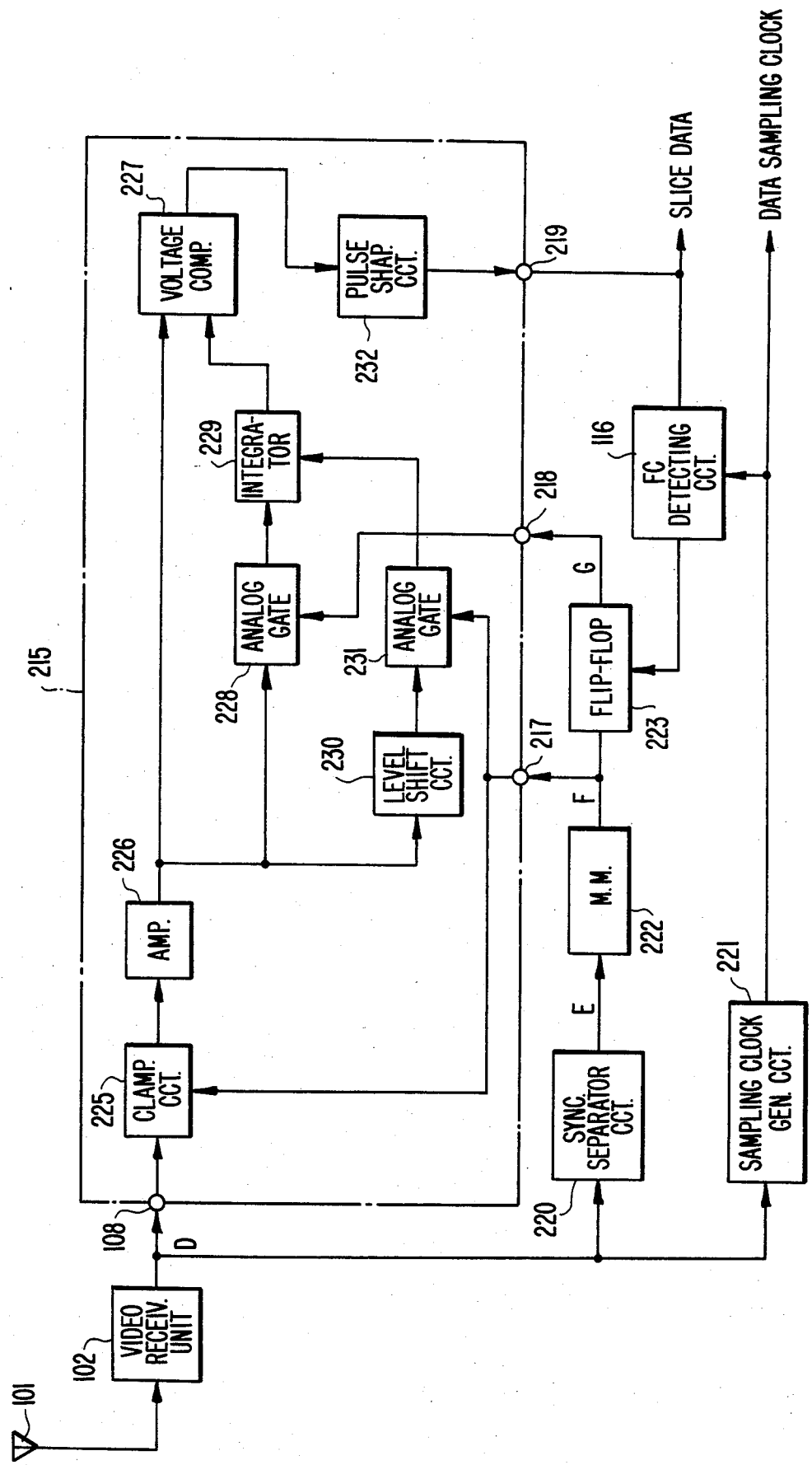
FIG. 11 is a block diagram of a data slicing circuit in a modified embodiment of the invention.
Figure 12:
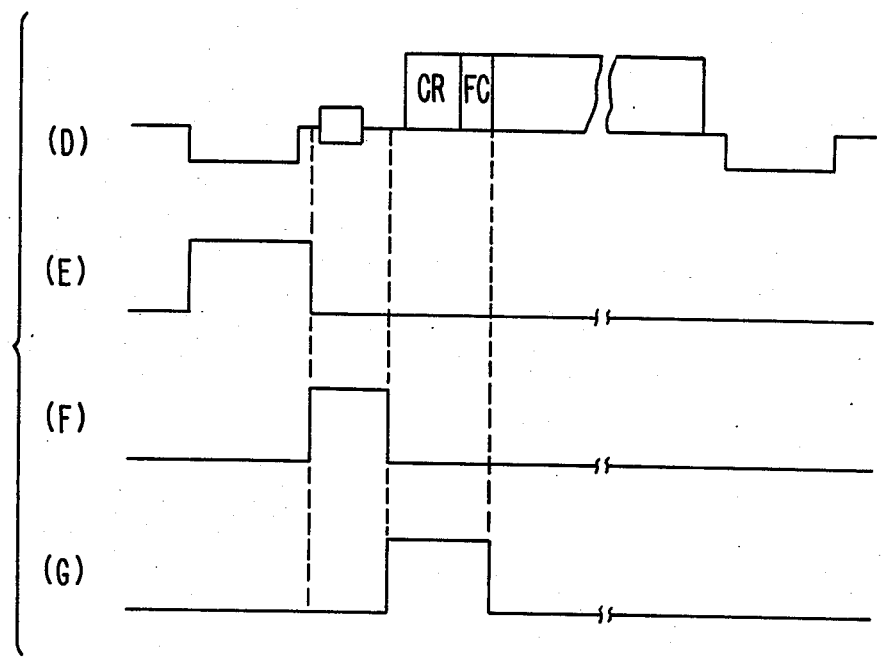
FIGS. 12 and 13 are waveform charts explanatory of operation of the data slicing circuit in FIG. 11.
Figure 13:
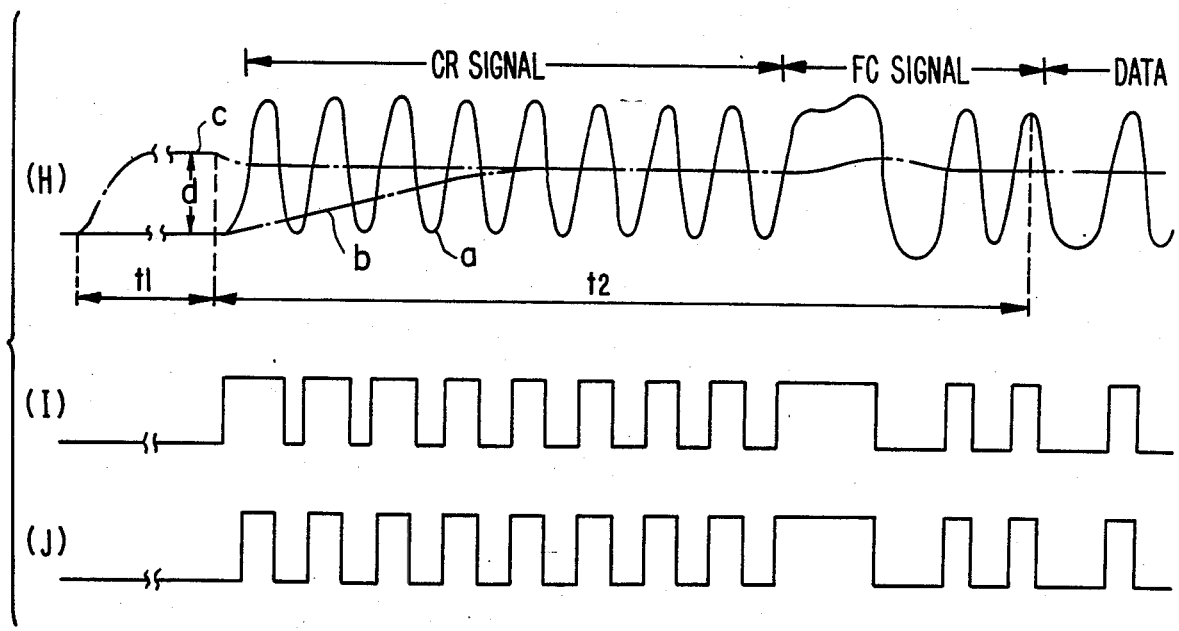

Next, a modified embodiment of the invention will be detailed in accordance with the drawings. FIG. 11 is a block diagram of the main circuit of the modified embodiment and FIGS. 12 and 13 are waveform charts explanatory of operation. In FIG. 11, reference numeral 215 designates a data slicing circuit, 107 designates an input terminal for the composite video signal, 217 designates an input terminal for clamp pulse, 218 designates an input terminal for a mean value detection gate pulse, and 219 designates an output terminal for the sliced data.

The composite video signal of the output from the video reception unit 102 is given to the data slicing circuit 215 through the input terminal 108 and also to a synchronous separator 220 (at need including the horizontal AFC and horizontal oscillator) and data sampling clock generator 221.

FIG. 12 shows the timing relation between the horizontal synchronizing signal of the composite video signal given to the input terminal 108, the clamp pulse with respect to the teletext signal, and the mean value detection gate pulse. FIG. 12-(D) shows the composite video signal given to the input terminal 108 in FIG. 11, which is the same as FIG. 1-(A), FIG. 12-(E) shows the horizontal synchronizing pulse of the output from the synchronous separator 220, and FIG. 12-(F) shows the clamp pulse given to the input terminal 217, which is obtained by triggering a mono-multivibrator 222 at the trailing edge of horizontal synchronizing pulse E and a pulse width of which is made as wide as possible in a range where it is kept out of CR shown in FIG. 12-(D). FIG. 12-(G) shows the mean value detection gate pulse given to the input terminal 218, which is obtained by setting a flip-flop 223 at the trailing edge of clamp pulse F and by resetting the same by the output pulse of FC detection circuit 116. Here, assuming that FC is the code of "11100101" as shown in FIG. 1-(C), the output pulse of FC detection circuit 116 is obtained in such a manner that the code is contained as the comparison pattern in the FC detection circuit 116 and coincides with FC detected by reading the sliced data with the data sampling clock signal. When FC is detected properly, the final bit of FC outputs the pulse shown in FIG. 12-(G). The teletext decoder starts to read-in the subsequent data for the first time when the FC is detected.

The data slicing circuit 215 slices the data by use of the composite video signal D in FIG. 12-(D), clamp pulse F in FIG. 12-(F) and mean value detection gate pulse G in FIG. 12-(G) through the following method:

The composite video signal D given to the input terminal 108 and multiplied with the teletext data, is clamped of its pedestal level by the clamp pulse F given from the input terminal 217 in a clamping circuit 225, and after clamped, amplified by an amplifier 226, one of the outputs thereof is given directly to one input terminal of a voltage comparator 227 and another two are given to an integrator 229 through an analog gate 228 and to the same through a level shift circuit 230 and an analog gate 231, an output waveform of integrator 229 at this time being shown in FIG. 13-(H), in which the period $t_1$ of clamp pulse F and that $t_2$ of mean value detection pulse G show the periods when the analog gates 231 and 228 are closed, and an output waveform a of amplifier 226 shows CR and FC enlarged in part.

Here, in case that there are no level shift circuit 230 and analog gate 231, the analog gate 228 is conductive for the period $t_2$ and the waveform a is integrated by the integrator 229. Behind the period $t_2$, the analog gate 228 is open so that the final voltage for the period $t_2$ is held. When the integrator 229 whose step response is about constant for the period of CR is used, its output is obtained as shown by b in FIG. 13-(H). In other words, the signal b converges toward the intermediate level of superposed data for the period of CR and the period of FC also keeps the same level and thereafter is held. Hence, the signal b is given to the other input terminal of voltage comparator 227, and the waveform a is sliced and shaped by a pulse shaping circuit 232, thereby obtaining at the output terminal 219 the teletext data signal sliced as shown in FIG. 13-(I).

Next, in a case where the level shift circuit 230 and analog gate 231 are provided, the analog gate 231 is conductive for the period $t_1$, and the pedestal voltage is charged, at its component raised by the level shift circuit 230, to the capacitor through the integrator 229 and preset.

For the period $t_2$, the analog gate 231 is open, the analog gate 228 is conductive, the preset voltage starts to be integrated, and the subsequent operation is the same as the above. If output impedance of analog gate 231 when conductive, is selected smaller enough to raise the output of integrator 229 for the period $t_1$ only to an extent of amount of level shift at the level shifter 230, an output C shown in FIG. 13-(H) is obtained as the output of integrator 229 at this time, while, an output of teletext data signal after sliced is as shown in FIG. 13-(J). An amount of level shift of level shift circuit 230 is shown by d in FIG. 13-(H) and need only be set to allow the duty ratio of CR after sliced to approach 50% as a whole.

In a case of comparison the waveform in FIG. 13-(I) with that in FIG. 13-(J), there is no difference after FC and the bit error rate of data portion can be said to be equal. When the FC detection circuit 116 detects FC, however, the waveform in FIG. 13 (I), especially the first half of CR, becomes alike to the FC signal pattern, so that when the RF input becomes weak and the S/N ratio of detected composite video signal deteriorates, the first half of CR is detected as CR by mistake in a high probability. If CR is detected by mistake, the subsequent data is read by mistake to result in the faults, such as line omission in the character multichannel broadcast of pattern transmission system or row omission in the same of code system.

Such property will be largely improved in such a manner that the first half of CR, as shown by C in FIG. 13-(H), is preset to an about intermediate level of data amplitude and the sliced data is formed as the waveform (J). In a case where FC is of code: "11100101" in Japan, since a level width of logic "1" at the first half of CR becomes smaller by making its level slightly higher than the intermediate level, the erroneous detection is not easy to occur.

Figure 14:
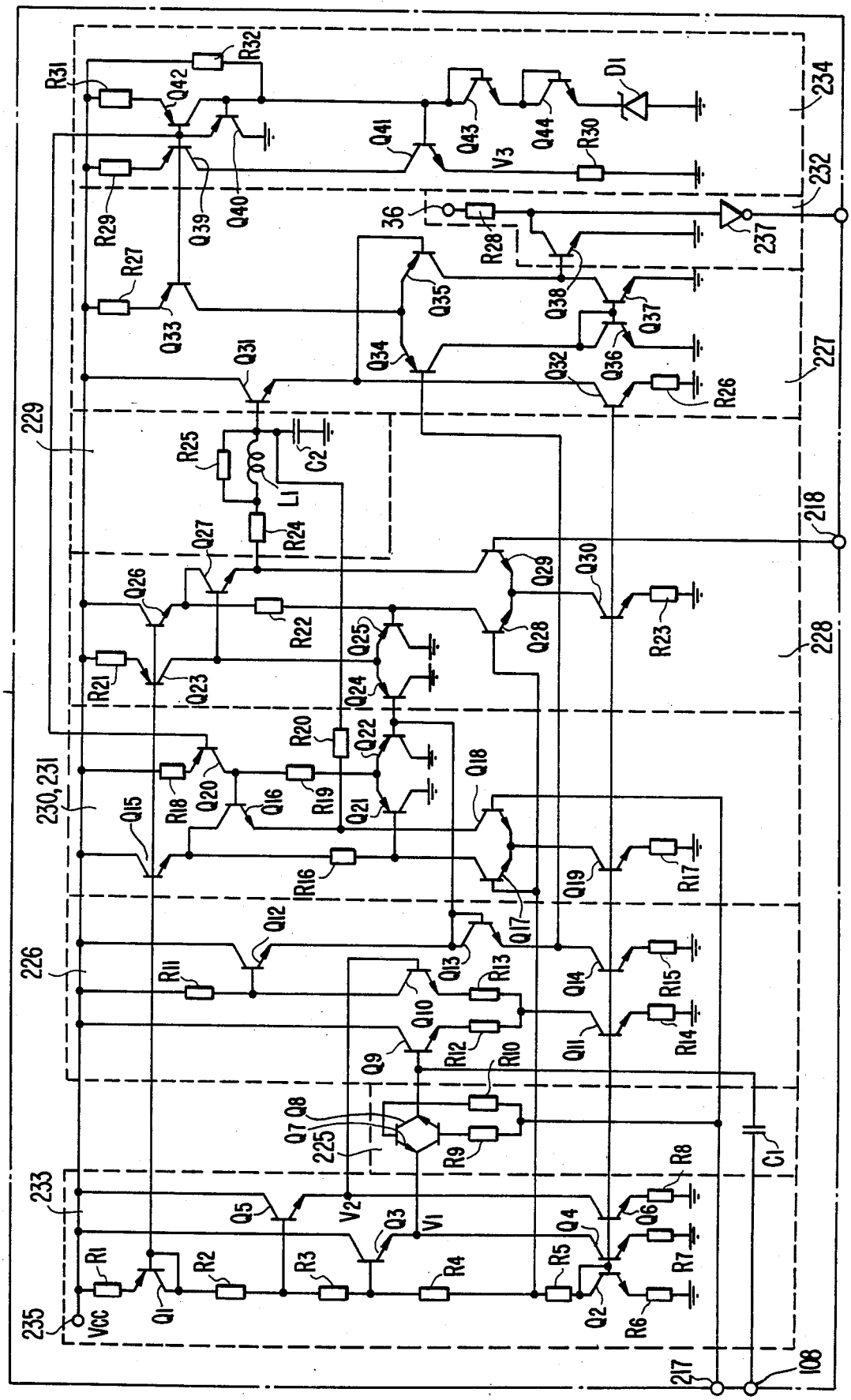
FIG. 14 is a concrete circuit diagram in part of the same.

The data slicing circuit 215 in FIG. 11 constructed to be suitable for the integration will be shown in FIG. 14, in which the components the same as in FIG. 11 are designated by the same reference numerals. Reference numerals 233 and 234 designate bias power source blocks for supplying necessary voltage and current to each unit in the circuit 215. Especially, the bias power source block 234 employs a Tener diode $D_1$ and temperature compensating transistors $Q_{43}$ and $Q_{44}$ and is adapted not to change the emitter voltage $V_2$ of a transistor $Q_{41}$ even with power source fluctuation or temperature change, 235 designates a power source for the circuit 215 applied with, for example, $+12$ V, and 236 designates a power source which decides the amplitude of output of sliced teletext data signal and selects voltage of $+5$ V when the output is connected in transistor-transistor logic (TTL).

Figure 15:
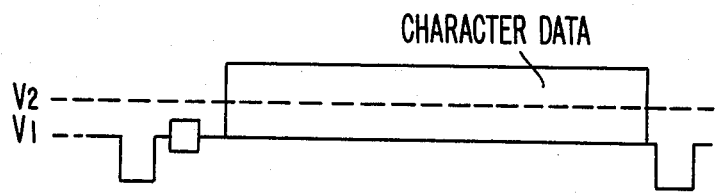
FIG. 15 is a waveform chart explanatory of the operating point of an amplifier in the data slicing circuit in FIG. 11.

The composite video signal on which the teletext data signal is superposed, is given through a capacitor $C_1$ to a differential amplifier comprising transistors $Q_9$ and $Q_{10}$ and resistances $R_{11}$, $R_{12}$ and $R_{13}$, the capacitor $C_1$ serving both as a clamping capacitor so that when the clamp pulse is given to an input terminal 217, the transistor $Q_7$ or $Q_8$ is conductive to clamp to the emitter voltage (V) of transistor $Q_3$ the pedestal portion of signal given to the base of transistor $Q_4$. While, the base bias of transistor $Q_{10}$, as shown in FIG. 15, is determined to be intermediate voltage of the teletext data signal component, thereby enabling the dynamic range of amplifier 226 to be made maximum, because the amplifier 226 need only function to amplify the teletext data signal component.

The teletext data signal prior to being sliced, as shown in FIG. 1-B, has been band-pass-limited to distort its waveform, whereby the amplitude of signal when sliced is better to be as large as possible in an allowable range of voltage source 235 because the phase fitter after sliced is reduced.

The clamp circuit 225 is effective for a means for maximizing the dynamic range of teletext data signal. When the signal is given to the transistor $Q_9$ by AC coupling because of no clamping circuit 225, variation of the intermediate level of video signal restricts the dynamic range to limit the teletext data amplitude which can be given to the voltage comparator 227. The amplified output obtained from the collector of transistor $Q_{10}$ passes through an emitter follower transistor $Q_{12}$ and is given in one part through a level shift diode $Q_{13}$ to one input terminal (the base of a transistor 34) at the volage comparator 227, the level shift diode $Q_{13}$ being interposed in order to compensate a voltage drop between the base and the emitter of a transistor $Q_{31}$ to be discussed below. The amplified output in the other part is given to the bases of transistors $Q_{24}$ and $Q_{22}$ respectively.

An analog gate 228 comprises transistors $Q_{23}$ through $Q_{30}$ and resistances $R_{21}$ through $R_{23}$, and an input terminal 218 is given pulse of the high level for the period $t_2$ shown in FIG. 13-(H), the pulse turning on the transistors $Q_{29}$, $Q_{27}$ and $Q_{25}$ (transistors $Q_{28}$ and $Q_{25}$ are off) and the input signal to the base of transistor $Q_{24}$ is given through transistors $Q_{24}$ and $Q_{27}$ to an integrator 229 comprising resistances $R_{24}$ and $R_{25}$, a capacitor $C_2$ and a coil $L_1$. When the input pulse to the input terminal 218 has the low level, the transistor $Q_{29}$ is off and that $Q_{28}$ on. Accordingly, since the base of transistor $Q_{25}$ is of low voltage, the transistor $Q_{25}$ is on and that $Q_{24}$ is off, whereby the base of transistor $Q_{27}$ is of low voltage. Since the emitter of transistor $Q_{27}$ is connected to the capacitor $C_2$ and applied with the former integrated voltage, the reverse bias is applied between the emitter and the collector of transistor $Q_{27}$ so that the transistor $Q_{27}$ is off to keep potential of capacitor $C_2$. Although the potential of capacitor $C_2$ drops by discharge for the base current of transistor $Q_{31}$, the voltage drop by the above discharge can be restricted in a negligible range by reducing a current value of the emitter current source (comprising a transistor $Q_{32}$ and a resistance $R_{26}$) for the transistor 31 and by increasing a value of capacitor $C_2$ to an allowable extent.

The output of integrator 229 is applied to the other input terminal (the base of transistor $Q_{35}$) of voltage comparator 227 through the emitter follower transistor $Q_{31}$ to thereby obtain the teletext data signal sliced as the output of the comparator circuit 227, the output further being shaped by a pulse-shaping transistor $Q_{38}$ and an inverter 37 and then output.

In addition, the transistors $Q_{36}$ and $Q_{37}$ in the voltage comparator 227 are active loads and a circuit comprising a transistor $Q_{33}$ and resistance $R_{27}$ constitutes a current source for the comparator 227.

The integrator 229 comprises resistances $R_{24}$ and $R_{25}$, capacitor $C_2$ and coil $L_1$ and when the constant values thereof are represented by R, r, C and L respectively, the transfer function G(S) of integrator is given by $$G(S) = \frac{(L/r)S + 1}{S LC(1 + R/r) + S(CR + L/r) + 1}, \quad (1)$$

whereby the values of R, r, L and C need only be determined to allow the step response of G(S) to have an about constant value for the period of CR signal respectively.

Next, the signal given to the transistor $Q_{22}$ levelshifts only to an extent of voltage drop by resistance $R_{19}$ because the transistors $Q_{18}$, $Q_{16}$ and $Q_{22}$ are on (transistors $Q_{17}$ and $Q_{21}$ are off) for the period (the period $t_1$ in FIG. 13-(H)) when the clamp pulse given to the input terminal 217 has a higher level, so that the voltage is charged to the capacitor $C_2$ at the integrator 229 through the transistor $Q_{16}$ and resistance 20. Hence, when resistance $R_{20}$ is selected to be smaller, the capacitor $C_2$ can be charged to the level-shifted voltage. When the input to the input terminal 217 becomes to have a low level in the same operation as explained of analog gate 228, the transistors $Q_{17}$ and $Q_{21}$ now are on and those $Q_{18}$, $Q_{22}$ and $Q_{16}$ are off, whereby the level shift is cut off from the capacitor $C_2$. As a result, the waveform of the output of integrator 229 is shown by C in FIG. 13-(H), so that the sliced data of duty ratio of about 50% is obtained from the front portion of CR as shown in FIG. 13-(J).

Also, a current to flow in the resistance $R_{19}$ is supplied by a current mirror circuit of transistors $Q_{20}$ and $Q_{39}$, whereby an amount of level shift obtained by voltage across the resistance $R_{19}$ is adapted not to change even when the power source fluctuates or the temperature changes. In other words, if the base current of transistor is neglected, voltage Vs across resistance 19 is given by the following equation:

$$V_s = \frac{V_z}{R_{30}} \times \frac{R_{29}}{R_{18}} \times R_{19} = \frac{R_{29} \cdot R_{19}}{R_{30} \cdot R_{18}} V_z \qquad (2)$$

Since Vz does not change with the power source fluctuation or temperature change, Vs divided by the resistance ratio also does not change. While, since the amplification factor of amplifier 226 depends on the ratio of resistance $(R_{12}+R_{13})$ and $R_{11}$, the teletext signal to be compared is not changed even with the power source fluctuation or temperature change, thereby enabling stable slice voltage to be preset with respect to the external change.

Next, another modified embodiment of the invention will be detailed in accordance with the drawings.

Figure 16:
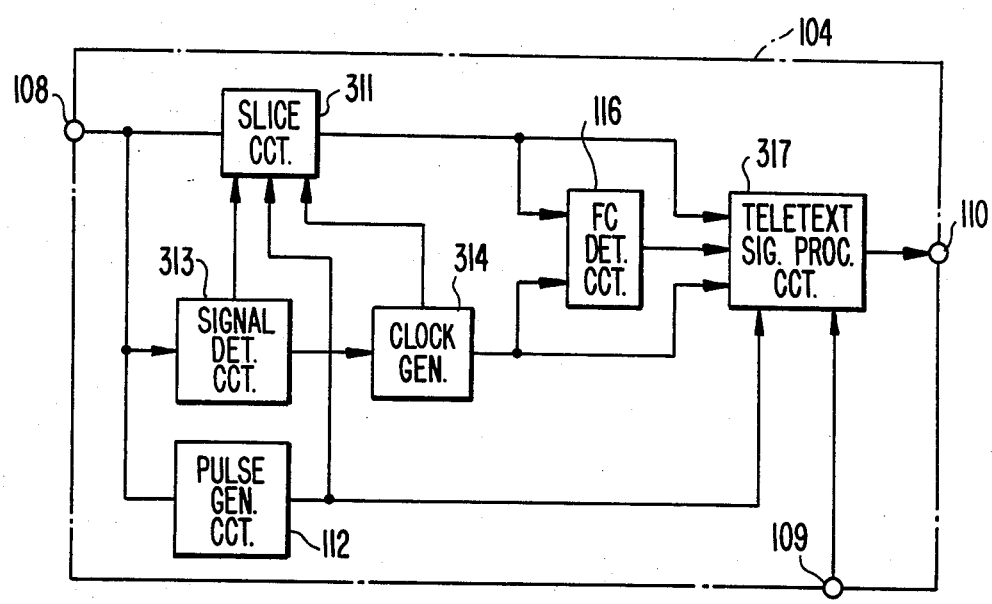
FIG. 16 is a block diagram in detail of the decoder unit in FIG. 5.

Referring to FIG. 16, the decoder unit 104 in FIG. 5 is detailed in the block diagram, in which reference numeral 108 designates an input terminal given the composite video signal detected by the video reception unit 102, 109 designates an input terminal given command pulse from the key-board 105, 110 designates an output terminal for outputting the character signal demodulated by the decoder unit 104 and connected to the video switching unit 106, 311 designates a slicing circuit which generates the sliced data signal from the teletext signal among the composite video signals fed from the input terminal 108, and 112 designates a synchronous separator (at need including a horizontal automatic frequency control circuit and a horizontal oscillator circuit) and a pulse generator for generating various gate pulses.

A signal detection circuit 313 includes a band-pass filter for passing therethrough CR in teletext signal, a gate circuit for passing the signal in the vicinity of CR, a doubler for doubling the frequency of an output signal from the gate circuit, and an amplitude detection circuit which detects the envelope of the output signal of the doubler.

Reference numeral 314 designates a sampling clock generator which generates a sampling clock signal for the sliced data signal in synchronism with the signal of doubled CR supplied from the signal-level detector 313, 116 designates a FC detection circuit which detects FC from the sliced data signal output from the slicing circuit 311 and the sampling clock output from the sampling clock generator, thereby generating the FC detection pulse, and 317 designates a teletext signal processing circuit which stores an information signal detected and reproduced after FC is detected from the sliced data signal, and outputs the stored signal as the signal which can be displayed in the CRT.

Figure 17:
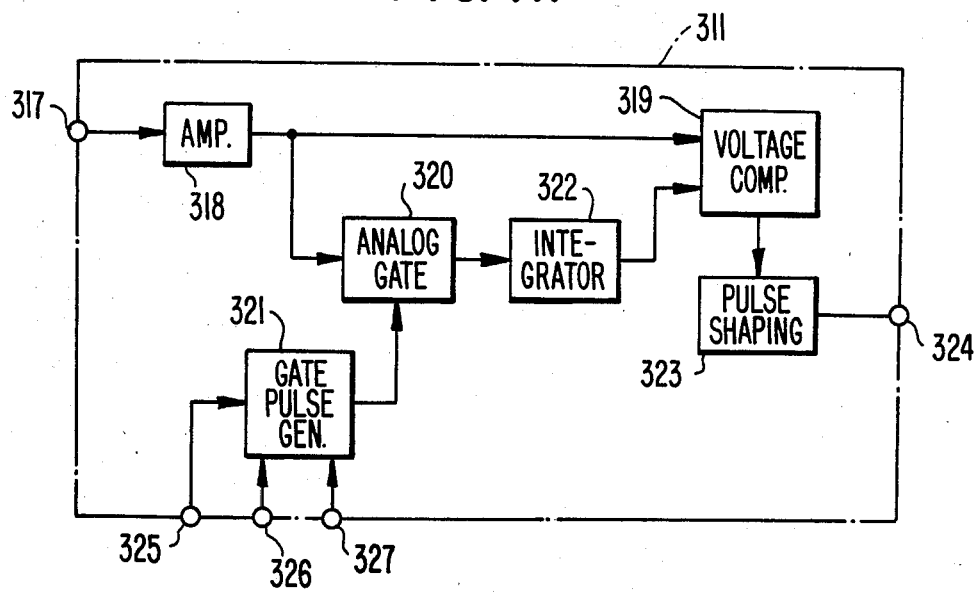
FIG. 17 is a further detailed block diagram of the slicing circuit in FIG. 16.

Referring to FIG. 17, the slicing circuit 311 in FIG. 16 will be further detailed, in which reference numeral 317 designates an input terminal for the composite video signal, the video signal being amplified by an amplifier 318 and then divided into two, one of which is given to a voltage comparator 319 and the other to an analog gate 320. The analog gate 320 passes only a CR portion of teletext data by the output of gate pulse generator 321, in which the output impedance of analog gate 320 is adapted to have the high level at the portion except for the picked-up CR, so that when the output is applied to the subsequent integrator 322, a proper time constant of integrator is set so that the output voltage is converged to the mean level of CR and thereafter the mean value of CR is held. CR, as abovementioned, comprises the pattern of logic "1010 . . . ", whereby the mean value thereof becomes center voltage of the teletext data amplitude. Such the obtained voltage is less affected by noises because of having passed the integration circuit and is good slice voltage not affected by the group delay distortion of video signal because of a single pattern of logic "1010 . . . " at the CR portion. Then, the composite video signal directly fed is sliced at the voltage comparator 319 by means of the output from the integrator 322 and pulse shaped by a pulse-shaping circuit 323, thereby obtaining at the output terminal 324 the teletext data reproduced into binary pulse. In addition, input terminals 325, 326 and 327 are given signals from the pulse generator 112, signal detection circuit 313 and sampling clock generator 314 respectively.

Figure 18:
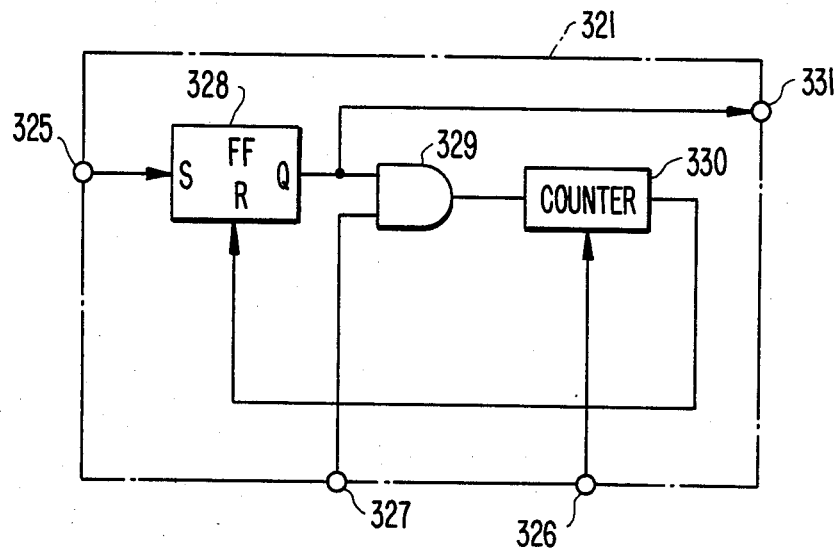
FIG. 18 is a concrete circuit diagram of a gate pulse generation circuit in FIG. 17.
Figure 19:
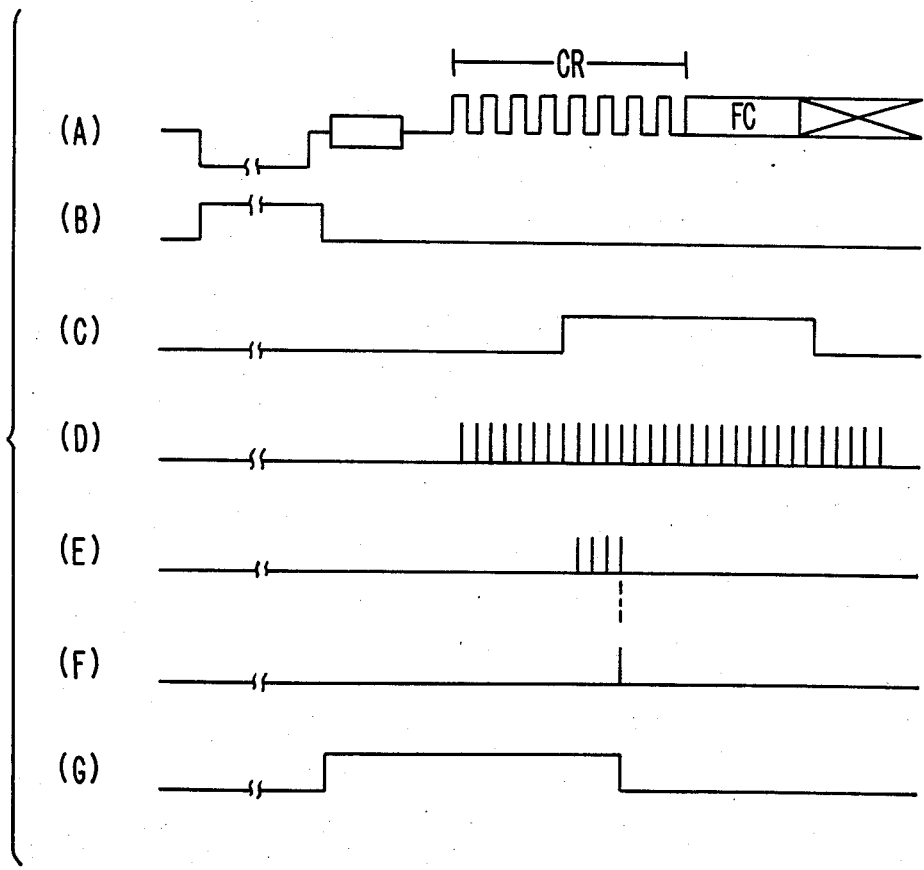
FIG. 19 is a waveform chart explanatory of operation of the same.

The gate pulse generator 321 is concretely shown in FIG. 18 and operation thereof is illustrated with waveforms shown in FIG. 19. FIG. 19-(A) shows the composite video signal on which the teletext data corresponding to FIG. 1 is superposed. FIG. 19-(B) shows one output pulse from the pulse generator 112 and in synchronism with the horizontal synchronizing signal, and is given to the input terminal 325 in FIG. 17. A flip-flop 328 in FIG. 18 is set at the trailing edge of the output pulse and its Q output opens an AND gate 329. The pulse shown in FIG. 19-(D) is given to the input terminal 327 from the sampling clock generator 314 and then to a counter 330 via the AND gate 329, which has been loaded through the input terminal 326 with the pulse shown in FIG. 19-(C) from the signal detection circuit 313 in FIG. 16, the output pulse from the signal detection circuit 313 being the same as shown in FIG. 7-(F). In addition, in FIG. 19, this invention sets a signal detection condition of the output pulse such that the leading edge thereof, as shown in FIG. 19 (C), is kept in about the center of CR of 16 bits. Then, the counter 330 is actuated to count by four the sampling clock pulse of the output from AND gate 329 and the output pulse from the counter 330 resets the flip-flop 328, so that the gate pulse shown in FIG. 19-(G) from the Q output of flip-flop 328 is obtained at the output terminal 331. In addition, FIG. 19-(E) shows a waveform of the output from AND gate 329, and FIG. 19-(F) shows that of output pulse from the counter 330.

Now, when the time constant of integrator 322 in FIG. 17 is set to converge to the mean value of amplitude of CR at about the eighth bit of the first half of CR, voltage resulting from the convergence is kept constant to the trailing edge of CR. Accordingly, in case that the timing for holding the mean value is set at about the twelfth bit of CR as shown in FIG. 19-(G), even if the timing of signal detection pulse in FIG. 19-(C) fluctuates due to variation of the level of video detection output or the frequency characteristic, the proper sliced voltage is held with an allowance of about ±four bits. When the time constant of integrator 322 is made further larger, the antinoise property of mean value detection voltage will be improved, but the meanvalue hold timing decreases in the allowance. Hence, these matters need only be designed collectively characteristically.

In addition, the count number of counter 330 is made four herein, which need only be set properly according to the timing of signal detection as shown in FIG. 19-(C). Also, a delay circuit, such as a monomultiplier, may of course be substituted for the counter. In this case, the allowance for the detection timing of signal detection pulse becomes somewhat smaller than that of counter due to variation in the element and the temperature characteristic, but the manufacturing cost is low.

As seen from the above, the teletext decoder of this invention detects the amplitude of CR picked up through the selected bandpass filter and the gate circuit passing the signal in the vicinity of CR and detects the superposed position of CR to block detection of FC before the detection timing, thereby obtaining only the correct FC detection pulse. Accordingly, the teletext decoder of less error can be obtained.

Although several embodiments have been described, they are merely exemplary of the invention and not to be constructed as limiting, the invention being defined solely by the appended claims.

What is claimed is:

1. A teletext decoder for decoding a teletext signal superposed on a television signal in a predetermined horizontal scanning period of the television signal, comprising:
   a band-pass filter passing therethrough a clock run-in signal (CR) included in said teletext signal;
   a clock run-in signal pickup circuit coupled to said band-pass filter for passing a part of an output signal of said band-pass filter, said part being a predetermined period substantially including a period during which said CR exists;
   a frequency doubler coupled to said clock run-in signal pickup circuit for doubling a frequency of an output signal of said clock run-in signal pickup circuit;
   an amplitude detection circuit coupled to said frequency doubler for detecting an amplitude of said CR included in an output signal of said frequency doubler and outputting an amplitude detection signal;
   a sampling clock generating circuit coupled to said frequency doubler for generating a sampling clock which is synchronized with said CR;
   a sampling clock gate circuit for passing said sampling clock during a predetermined period after receiving said amplitude detection signal;
   a slicing circuit for slicing said teletext signal to obtain a sliced data signal;
   a framing code detection circuit coupled to said slicing circuit for detecting a framing code signal (FC) included in said sliced data signal and outputting a FC detection signal, said framing code detection circuit being operated by said sampling clock passed through said sampling clock gate circuit; and
   a teletext signal processing circuit responsive to said FC detection signal for decoding an information signal included in said sliced data signal.

2. The teletext decoder according to claim 1, wherein said sampling clock gate circuit comprises a flip-flop circuit which is set by a leading edge of said amplitude detection circuit and reset by a horizontal synchronizing signal of said television signal, and a gate circuit for passing said sampling clock from said sampling clock generating circuit when said flip-flop circuit is in a set status.

3. The teletext decoder according to claim 1, wherein said frequency doubler comprises a differential amplifier for full-wave rectifying said output signal of said pickup circuit, a first output of said differential amplifier being connected to said sampling clock generating circuit, a second output of said differential amplifier being connected to said amplitude detection circuit.

4. The teletext decoder according to claim 3, wherein said amplitude detection circuit comprises a circuit for producing an envelope of a positive portion of said second output of said differential amplifier, and a circuit for comparing said envelope with a predetermined reference level so as to thereby produce said amplitude detection signal.

5. The teletext decoder according to claim 1, wherein said slicing circuit comprises:
   an amplifier for amplifying said teletext signal;
   a first analog gate circuit for passing an output signal of said amplifier;
   an integrator for integrating said output signal of said amplifier passed through said first analog gate circuit thereby to obtain a reference level signal which substantially corresponds to a means value of said teletext signal;
   a level shift circuit for shifting upward said output signal of said amplifier by a predetermined voltage;
   a second analog gate circuit for passing an output signal of said level shift circuit during a predetermined period after a trailing edge of a horizontal synchronizing signal of said television signal, said output signal of said level shift circuit passed through said second analog gate circuit being applied to said integrator;
   a voltage comparator for comparing said output signal of said amplifier with said reference level signal thereby to obtain a binary data signal contained in said teletext signal; and
   a pulse shaping circuit for shaping said binary data signal to obtain said sliced data signal.

6. The teletext decoder according to claim 5, wherein said slicing circuit further comprises a clamp circuit disposed before said amplifier for clamping a pedestal level of said television signal so that said amplifier operates in its maximum dynamic range.

7. A teletext decoder for decoding a teletext signal superposed on a television signal in a predetermined horizontal scanning period of the television signal, comprising:
   a band-pass filter passing therethrough a clock run-in signal (CR) included in said teletext signal;
   a clock run-in signal pickup circuit coupled to said band-pass filter for passing a part of an output signal of said band-pass filter, said part being a predetermined period substantially including a period during which said CR exists;
   a frequency doubler coupled to said clock run-in signal pickup circuit for doubling a frequency of an output signal of said clock run-in signal pickup circuit;
   an amplitude detection circuit coupled to said frequency doubler for detecting an amplitude of said CR included in an output signal of said frequency doubler and outputting an amplitude detection signal;
   a sampling clock generating circuit coupled to said frequency doubler for generating a sampling clock which is synchronized with said CR;
   a slicing circuit for slicing said teletext signal to obtain a sliced data signal;
   a sliced data gate circuit for passing said sliced data signal during a predetermined period of after receiving said amplitude detection signal;

a framing code detection circuit operated by said sampling clock for detecting a framing code signal (FC) included in said sliced data signal passed through said sliced data gate circuit and outputting a FC detection signal; and a teletext signal processing circuit responsive to said FC detection signal for decoding an information signal included in said sliced data signal passed through said sliced data gate circuit.

8. The teletext decoder according to claim 7, wherein said sliced gate circuit comprises a flip-flop circuit which is set by a leading edge of said amplitude detection signal and reset by a horizontal synchronizing signal of said television signal, and a gate circuit for passing said sliced data signal from said slicing circuit when said flip-flop circuit is in a set status.

9. The teletext decoder according to claim 7, wherein said frequency doubler comprises a differential amplifier for full-wave rectifying said output signal of said pickup circuit, a first output of said differential amplifier being connected to said sampling clock generating circuit, a second output of said differential amplifier being connected to said amplitude detection circuit.

10. The teletext decoder according to claim 9, wherein said amplitude detection circuit comprises a circuit for producing an envelope of a positive portion of said second output of said differential amplifier, and a circuit for comparing said envelope with a predetermined reference level so as to thereby produce said amplitude detection signal.

11. The teletext decoder according to claim 7, wherein said slicing circuit comprises:

an amplifier for amplifying said teletext signal;

a first ananlog gate circuit for passing an output signal of said amplifier;

an integrator for integrating said output signal of said amplifier passed through said first analog gate circuit so as to thereby obtain a reference level signal which substantially corresponds to a mean value of said teletext signal;

a level shift circuit for shifting said output signal of said amplifier upward by a predetermined voltage;

a second analog gate circuit for passing an output signal of said level shift circuit during a predetermined period after a trailing edge of a horizontal synchronizing signal of said television signal, aid output signal of said level shift circuit passed through said second analog gate circuit being applied to said integrator;

a voltage comparator for comparing said output signal of said amplifier with said reference level signal so as to thereby obtain a binary data signal contained in said teletext signal; and a pulse shaping circuit for shaping said binary data signal to obtain said sliced data signal.

12. The teletext decoder according to claim 11, wherein said slicing circuit further comprises a clamp circuit disposed before said amplifier for clamping a pedestal level of said television signal so that said amplifier operates in its maximum dynamic range.

13. A teletext decoder for decoding a teletext signal superposed on a television signal in a predetermined horizontal scanning period of the television signal, comprising:

a band-pass filter passing therethrough a clock run-in signal (CR) included in said teletext signal;

a clock run-in signal pickup circuit coupled to said band-pass filter for passing a part of an output signal of said band-pass filter, said part being a predetermined period substantially including a period during which said CR exists;

a frequency doubler coupled to said clock run-in signal pickup circuit for doubling a frequency of an output signal of said clock run-in signal pickup circuit;

an amplitude detection circuit coupled to said frequency doubler for detecting an amplitude of said CR included in an output signal of said frequency doubler and outputting an amplitude detection signal;

a sampling clock generating circuit coupled to said frequency doubler for generating a sampling clock which is synchronized with said CR;

a slicing circuit for slicing said teletext signal to obtain a sliced data signal;

a framing code detection circuit operated by said sampling clock for detecting a framing code signal (FC) included in said sliced data signal and outputting a FC detection signal;

a framing code detection pulse gate circuit for passing said FC detection signal after receiving said amplitude detection circuit; and a teletext signal processing circuit responsive to said FC detection signal passed through said framing code detection pulse gate circuit for decoding an information signal included in said sliced data signal.

14. The teletext decoder according to claim 13, wherein said framing code detection pulse gate circuit comprises a flip-flop circuit which is set by a leading edge of said amplitude detection signal and reset by a horizontal synchronizing signal of said television signal, and a gate circuit for passing said FC detection signal from said framing code detection circuit when said flip-flop circuit is in a set status.

15. The teletext decoder according to claim 13, wherein said frequency doubler comprises a differential amplifier for full-wave rectifying said output signal of said pickup circuit, a first output of said differential amplifier being connected to said sampling clock generating circuit, a second output of said differential amplifier being connected to said amplitude detection circuit.

16. The teletext decoder according to claim 15, wherein said amplitude detection circuit comprises a circuit for producing an envelope of a positive portion of said second output of said differential amplifier, and a circuit for comparing said envelope with a predetermined reference level so as to thereby produce said amplitude detection signal.

17. The teletext decoder according to claim 13, wherein said slicing circuit comprises:

an amplifier for amplifying said teletext signal;

a first analog gate circuit for passing an output signal of said amplifier;

an integrator for integrating said output signal of said amplifier passed through said first analog gate circuit so as to thereby obtain a reference level signal which substantially corresponds to a means value of said teletext signal;

a level shift circuit for shifting said output signal of said amplifier upward by a predetermined voltage;

. a second analog gate circuit for passing an output signal of said level shift circuit during a predetermined period after a trailing edge of a horizontal synchronizing signal of said television signal, said output signal of said level shift circuit passed through said second analog gate circuit being applied to said integrator;

a voltage comparator for comparing said output signal of said amplifier with said reference level signal so as to thereby obtain a binary data signal contained in said teletext signal; and a pulse shaping circuit for shaping said binary data signal to obtain said sliced data signal.

18. The teletext decoder according to claim 17, wherein said slicing circuit further comprises a clamp circuit disposed before said amplifier for clamping a pedestal level of said television signal so that said amplifier operates in its maximum dynamic range.

19. A teletext decoder for decoding a teletext signal superposed on a television signal in a predetermined horizontal scanning period of the television signal, comprising:

a band-pass filter passing therethrough a clock run-in signal (CR) included in said teletext signal;

a clock run-in signal pickup circuit coupled to said band-pass filter for passing a part of an output signal of said band-pass filter, said part being a predetermined period substantially including a period during which said CR exists;

a frequency doubler coupled to said clock run-in signal pickup circuit for doubling a frequency of an output signal of said clock run-in signal pickup circuit;

an amplitude detection circuit coupled to said frequency doubler for detecting an amplitude of said CR included in an output signal of said frequency doubler and outputting an amplitude detection signal;

a sampling clock generating circuit coupled to said frequency doubler for generating a sampling clock which is synchronized with said CR;

a slicing circuit for slicing said teletext signal to obtain a sliced data signal after receiving said amplitude detection circuit;

a framing code detection circuit operated by said sampling clock for detecting a framing code signal (FC) included in said sliced data and outputting a FR detection signal; and a teletext signal processing circuit responsive to said FR detection signal for decoding an information signal included in said sliced data;

wherein said slicing circuit comprises:

an amplifier for amplifying said teletext signal;

a gate pulse generating circuit for generating a gate pulse having a predetermined duration after receiving said amplitude detection signal;

an analog gate circuit for passing an output signal of said amplifier during the duration of said gate pulse;

an integrator for integrating an output signal of said analog gate circuit when said analog gate circuit is passing said output signal of said amplifier, and holding the integrated signal when said analog gate circuit is blocking said output signal of said amplifier, so as to thereby output a reference level signal which substantially corresponds to a mean value of said output signal of said amplifier;

a voltage comparator for comparing said output signal of amplifier with said reference level signal so as to thereby obtain a binary data signal contained in said teletext signal; and a pulse shaping circuit for shaping said binary data signal to obtain said sliced data signal.

20. The teletext decoder according to claim 19, wherein said gate pulse generating circuit comprises a flip-flop set by a leading edge of said amplitude detection signal, and a delay circuit for generating a pulse after said duration from a time said flip-flop is set, said flip-flop being reset by said pulse generated by said delay circuit.

21. The teletext decoder according to claim 19, wherein said frequency doubler comprises a differential amplifier for full-wave rectifying said output signal of said pickup circuit, a first output of said differential amplifier being connected to said sampling clock generating circuit, a second output of said differential amplifier being connected to said amplitude detection circuit.

22. The teletext decoder according to claim 21, wherein said amplitude detection circuit comprises a circuit for producing an envelope of a positive portion of said second output of said differential amplifier, and a circuit for comparing said envelope with a predetermined reference level so as to thereby produce said amplifier detection signal.

* * * * *